(12) United States Patent
Oh et al.

(10) Patent No.: US 10,485,148 B2
(45) Date of Patent: Nov. 19, 2019

(54) DISPLAY DEVICE

(71) Applicant: LG ELECTRONICS INC., Seoul (KR)

(72) Inventors: Honglyeol Oh, Seoul (KR); Jinwook Kim, Seoul (KR); Hyeuk Chang, Seoul (KR); Joongnyon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/912,399

(22) Filed: Mar. 5, 2018

(65) Prior Publication Data

US 2018/0263142 A1    Sep. 13, 2018

(30) Foreign Application Priority Data

Mar. 9, 2017 (KR) .......................... 10-2017-0030164

(51) Int. Cl.
| | | |
|---|---|---|
| *H05K 7/20* | (2006.01) | |
| *H05K 5/02* | (2006.01) | |
| *H05K 5/06* | (2006.01) | |
| *G06F 1/20* | (2006.01) | |

(52) U.S. Cl.
CPC .......... *H05K 7/20972* (2013.01); *G06F 1/20* (2013.01); *H05K 5/0213* (2013.01); *H05K 5/0217* (2013.01); *H05K 5/069* (2013.01)

(58) Field of Classification Search
CPC ............. H05K 7/20972; H05K 5/0213; H05K 5/0217; H05K 5/069; G06F 1/20
See application file for complete search history.

(56) References Cited

U.S. PATENT DOCUMENTS

| | | | | |
|---|---|---|---|---|
| 7,164,586 B2 * | 1/2007 | Lin | .................... | H05K 7/20972 348/794 |
| 8,274,622 B2 * | 9/2012 | Dunn | ................. | H05K 7/20972 349/161 |
| 8,773,633 B2 * | 7/2014 | Dunn | ................ | G02F 1/133308 349/161 |

(Continued)

FOREIGN PATENT DOCUMENTS

| | | |
|---|---|---|
| JP | 2502633 | 6/1996 |
| JP | 2006058679 | 3/2006 |

OTHER PUBLICATIONS

PCT International Application No. PCT/KR2018/002218, Notification of Transmittal of the International Search Report and the Written Opinion of the International Searching Authority, or Declaration dated Jun. 22, 2018, 11 pages.

*Primary Examiner* — Hoa C Nguyen
*Assistant Examiner* — Keith DePew
(74) *Attorney, Agent, or Firm* — Lee, Hong, Degerman, Kang & Waimey

(57) ABSTRACT

There is disclosed a display device comprising a display module, an outer case in which the display module is mounted and defining an internal space which is closed airtight from the outside, and an inner case coupled to the display module, wherein the inner case which partitions off the internal space into a first closed space having a rear surface of the display module exposed thereto and a second closed space having a front surface of the display module exposed thereto, and the first closed space is surrounded by the second closed space with respect to one cross section.

9 Claims, 16 Drawing Sheets

(56) References Cited

U.S. PATENT DOCUMENTS

| | | | | |
|---|---|---|---|---|
| 8,854,572 B2* | 10/2014 | Dunn | | H05K 7/20972 |
| | | | | 349/58 |
| 9,456,525 B2* | 9/2016 | Yoon | | H05K 7/20145 |
| 9,470,924 B2* | 10/2016 | Dunn | | G02F 1/133382 |
| 9,835,893 B2* | 12/2017 | Dunn | | H05K 7/20154 |
| 9,894,800 B2* | 2/2018 | Dunn | | G02F 1/133385 |
| 10,088,702 B2* | 10/2018 | Dunn | | G02F 1/133382 |
| 2002/0014840 A1* | 2/2002 | Kaneko | | H05K 7/20963 |
| | | | | 313/587 |
| 2005/0124221 A1* | 6/2005 | Lin | | H05K 7/20972 |
| | | | | 439/620.01 |
| 2009/0126914 A1* | 5/2009 | Dunn | | H05K 7/20972 |
| | | | | 165/121 |
| 2009/0135365 A1* | 5/2009 | Dunn | | H05K 7/20972 |
| | | | | 349/161 |
| 2009/0277604 A1* | 11/2009 | Kang | | G07F 9/00 |
| | | | | 165/56 |
| 2011/0085301 A1* | 4/2011 | Dunn | | G02F 1/133385 |
| | | | | 361/695 |
| 2012/0236499 A1* | 9/2012 | Murayama | | H04N 5/64 |
| | | | | 361/696 |
| 2013/0222754 A1* | 8/2013 | Kohtoku | | G02F 1/133603 |
| | | | | 349/161 |
| 2015/0009625 A1* | 1/2015 | Chin | | H05K 7/20145 |
| | | | | 361/695 |
| 2016/0198589 A1* | 7/2016 | Kang | | G02F 1/133385 |
| | | | | 361/692 |
| 2017/0172016 A1* | 6/2017 | Kang | | G09F 9/33 |
| 2017/0293177 A1* | 10/2017 | Yeh | | G02F 1/133308 |

* cited by examiner

DISPLAY DEVICE

CROSS-REFERENCE TO RELATED APPLICATIONS

Pursuant to 35 U.S.C. § 119(a), this application claims the benefit of earlier filing date and right of priority to Korean Patent Application No. 10-2017-0030164, filed on Mar. 9, 2017, the contents of which are hereby incorporated by reference herein in its entirety.

BACKGROUND OF THE DISCLOSURE

Field of the Disclosure

Embodiments of the present disclosure relate to a display device which considers a heat radiation structure.

Background of the Disclosure

A display device means one mechanical unit which defines a display module mounted therein.

Such a display device usually has a large-inch display and is located in an external surface of which the temperature is very different from ambient temperatures and which has many foreign substances such as dust.

Under such environmental conditions, the display device has a relatively high brightness to secure a sufficient outdoor visibility. The display device is likely to be neglected under a high outdoor temperature. Accordingly, it is necessary to provide a structure which is capable of dissipate the heat generated by the drive of the display device.

The heat radiation or dissipation is realized in the display device in diverse ways. Main examples of the heat radiation include an air-cooling method and a water-cooling method. Also, there is a further contact method which uses a heat pipe.

Such the heat radiation cooling methods may be used exclusively. As occasion demands, two or more methods may be used combinedly.

The air cooling method out of the methods mentioned above may include a direct cooling method configured to filter dust or inflow foreign substances, using a filter, while direct inflow of external air is allowed and an indirect cooling method configured to generate heat exchange between external air and internal air of the device, using a heat exchanger, while external air and internal air are basically shut off from each other.

Considering the characteristic of the display device exposed to dust and foreign substances, the indirect cooling method can be a good choice. However, external air is not directly heat exchanged with a heat generation region in the indirect cooling method and heat radiation efficiency may be a major issue in the indirect cooling method.

Especially, heat is likely to be generated in some regions of the display device such as a front panel of a display module, in a rear backlight unit of the display module and other electronic components. If only one circulation structure is provided, the internal air which has failed heat exchange might pass other heat generation regions as it is only to fail sufficient heat exchange.

Accordingly, there are demands for an air circulation method via an internal or external structure of the display device or the specification of the air circulation structure for effective heat radiation.

Moreover, the display device is configured to have the display module mounted therein. The display module means one part including a display panel, an optical sheet and a light source unit and mounted in the display device as one assembly.

The heat generated in the display module including the components mentioned above represents a significant portion of the overall heat generated in the display device. Accordingly, it is necessary to consider a heat radiation structure for mainly radiating the heat generated in the display module.

SUMMARY OF THE DISCLOSURE

Accordingly, an object of the present invention is to address the above-noted and other problems.

An object of the present disclosure is to solve the disadvantage of the heat radiation in the display device mentioned above.

Embodiments of the present disclosure may provide a display device comprising a display module; an outer case in which the display module is mounted and defining an internal space which is closed airtight from the outside; and an inner case coupled to the display module, wherein the inner case which partitions off the internal space into a first closed space having a rear surface of the display module exposed thereto and a second closed space having a front surface of the display module exposed thereto, and the first closed space is surrounded by the second closed space with respect to one cross section.

The display device may further comprise a first open hole configured to allow a first region of an outer surface of the outer case and a second region of an outer surface of the inner case adjacent to the first region to form an outer passage, and the first open hole passes between the first closed space and the second closed space.

The outer case may comprise a plurality of outer surfaces which are toward different directions, respectively, and an inlet of the first open hole may formed in one of the outer surfaces and an outlet of the first open hole is formed in another one of the outer surfaces.

The display device may further comprise a partition bracket provided between the first region and the second region and configured to partition off the inlet and the outlet of the first open hole, wherein an inlet of the first open hole is formed in the first region of the outer case and an outlet of the first open hole is formed in the second region adjacent to the first region.

The partition bracket may allow the first open hole to form a '⊏'-shaped passage.

The partition bracket may further comprise a branched bracket configured to widen an angle between a direction toward the inlet and a direction toward the outlet of the first open hole.

The first open hole may further comprise a guide bracket configured to bending air flow of an outer passage.

Embodiments of the present disclosure may also provide a display device comprising a display module; an outer case in which the display module is mounted and defining an internal space which is closed airtight from the outside; and an inner case coupled to the display module, wherein the inner case which partitions off the internal space into a first closed space having a rear surface of the display module exposed thereto and a second closed space having a front surface of the display module exposed thereto, and the display device further comprises a second open hole configured to allow a third region of the outer surface of the outer case to form an outer passage, and the second open hole is surrounded by the first closed space and the first closed space forms a closed loop.

Embodiments of the present disclosure may also provide a display device comprising a display module; an outer case in which the display module is mounted and defining an internal space which is closed airtight from the outside; and a third open hole configured to allow a fourth region of the outer surface of the outer case to form an outer passage, wherein the third open hole comprise a first heat radiation portion configured to form one of a rear surface of the outer case; a second heat radiation portion spaced apart from the first heat radiation portion; and a connecting portion configured to connect the first heat radiation and the second heat radiation portion with each other in one region.

The internal space may form a closed loop which circulates around the front surface space of the display module and the spaced gap.

The display device according to at least one embodiment mentioned above is capable of enhancing heat radiation efficiency.

Furthermore, the display device according to at least one embodiment is capable of emitting the heat generated in the display module effectively.

Still further, the display device according to at least one of the embodiments is able to reduce the possibility of the mixture between inlet air and outlet air.

Still further, the display device according to at least one embodiment is able to making the direction of natural convection be equal to the direction of forcible convection.

Still further, the visibility of the inlet and the outlet of the open hole may be minimized.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings, which are given by illustration only, and thus are not limitative of the present invention, and wherein.

DESCRIPTION OF SPECIFIC EMBODIMENTS

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context. Terms such as "include" or "has" are used herein and should be understood that they are intended to indicate an existence of several components, functions or steps, disclosed in the specification, and it is also understood that greater or fewer components, functions, or steps may likewise be utilized.

A display device 100 which is described hereinafter commonly means all type of devices including an output unit for outputting an image. Main examples of the display device include a digital TV, an analog TV, a desktop computer, a digital signage and the like.

Moreover, the examples of the display device may further include a middle-sized or large-sized output device such as a signage which is installed in an outdoor housing.

There is an outdoor billboard as one example of the output device.

As mentioned above, exemplary embodiments of the present disclosure are invented and developed with a focus on the display device such as the signage installed in such an outdoor housing.

Figure 1:
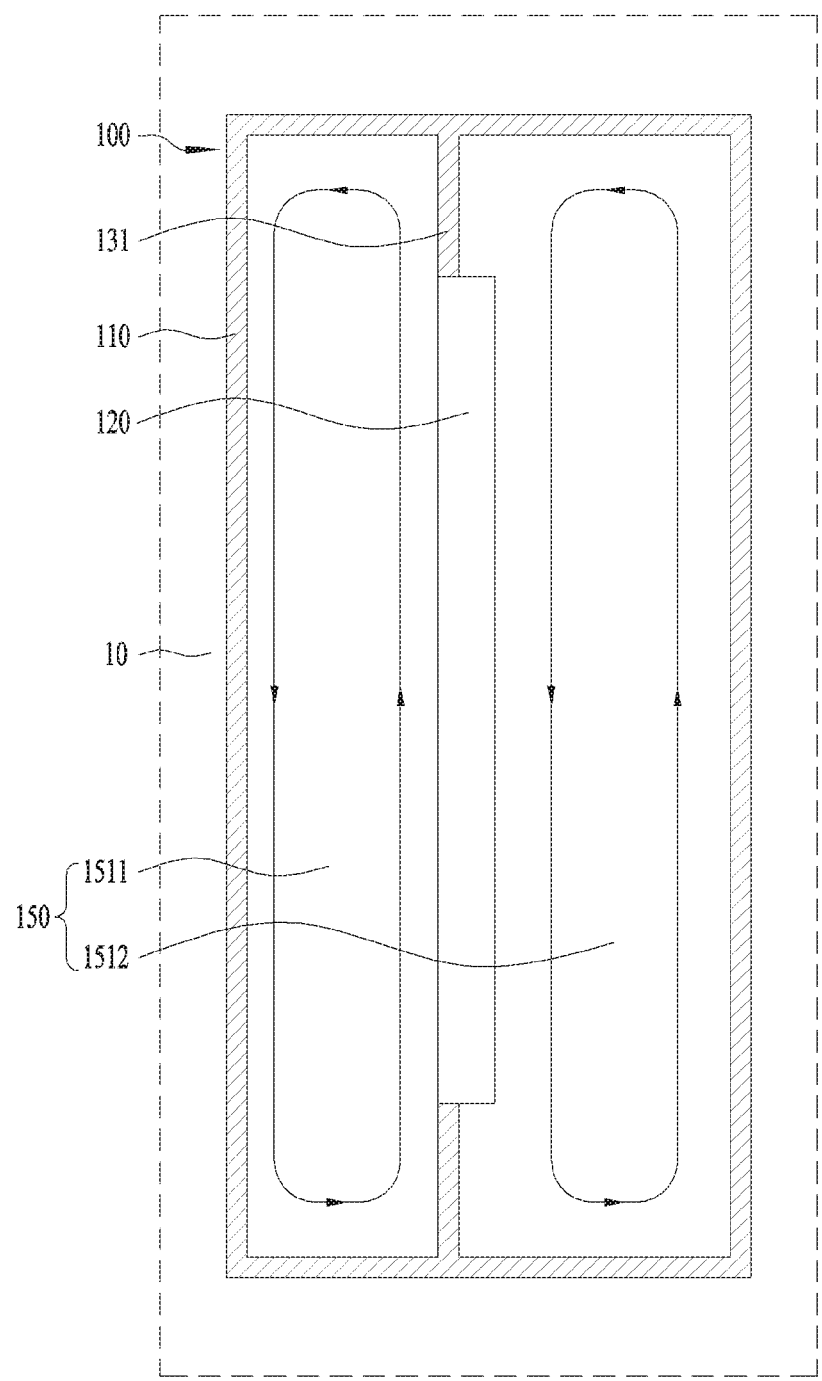
FIG. 1 is a sectional conceptual diagram illustrating one embodiment of a display device in accordance with the present disclosure.

FIG. 1 is a sectional conceptual diagram illustrating one embodiment of a display device 100 in accordance with the present disclosure.

As mentioned above, heat is generated in a front surface of the display module 120 by a display panel and heat is generated in a rear surface of the display module 120 by a backlight unit, a drive unit for driving the display module 120 and a control unit. In case such heat is radiated without partitioning the space where the front and rear surfaces of the display module 120 off into independent spaces, heat is likely to be drawn from one region of the space to another region and heat radiation is then likely to be performed inefficiently.

The present embodiment of the display device realizes a heat radiation structure configured to cooling each region of the space independently to reflect such features and problems.

An outer case 110 may define an exterior of the display device 100. The outer case 110 has an internal space closed from an external space 10.

A partition wall 131 may be configured to partition the internal space 150 off into a front surface space 1511 to which the front surface of the display module 120 is exposed and a rear surface space 1512 to which the rear surface of the display module 120 is exposed by connecting one region of the display and one region of the outer case 110 with each other.

For easy explanation sake, the space having the rear surface of the display module 120 exposed thereto, which is portioned off from the internal space 150 by the partition wall 131, is defined as the first closed space 1521 and the space having the front surface of the display module 120 exposed thereto, which is also partitioned off from the internal space 150 by the partition wall 131 is defined as the second closed space 1522.

Air of the front space 1511 is provided with the heat generated from the front surface of the display module 120 and exchanges heat with air of the external space 10 located outside the outer case 110. Air of the rear surface space 1512 is provided with the heat generated in the rear surface of the display module 120, the drive unit and the control unit and exchanges heat with air of the external space 10 located outside the outer case 110.

The air of the front surface space 1511 only exchanges heat with the air of the external space 10 or the rear surface space 1512, not mixed with. The air of the rear surface space 1512 also only exchanges heat with the air of the external space 10 or the front surface space 1511, not mixed with.

Figure 2:
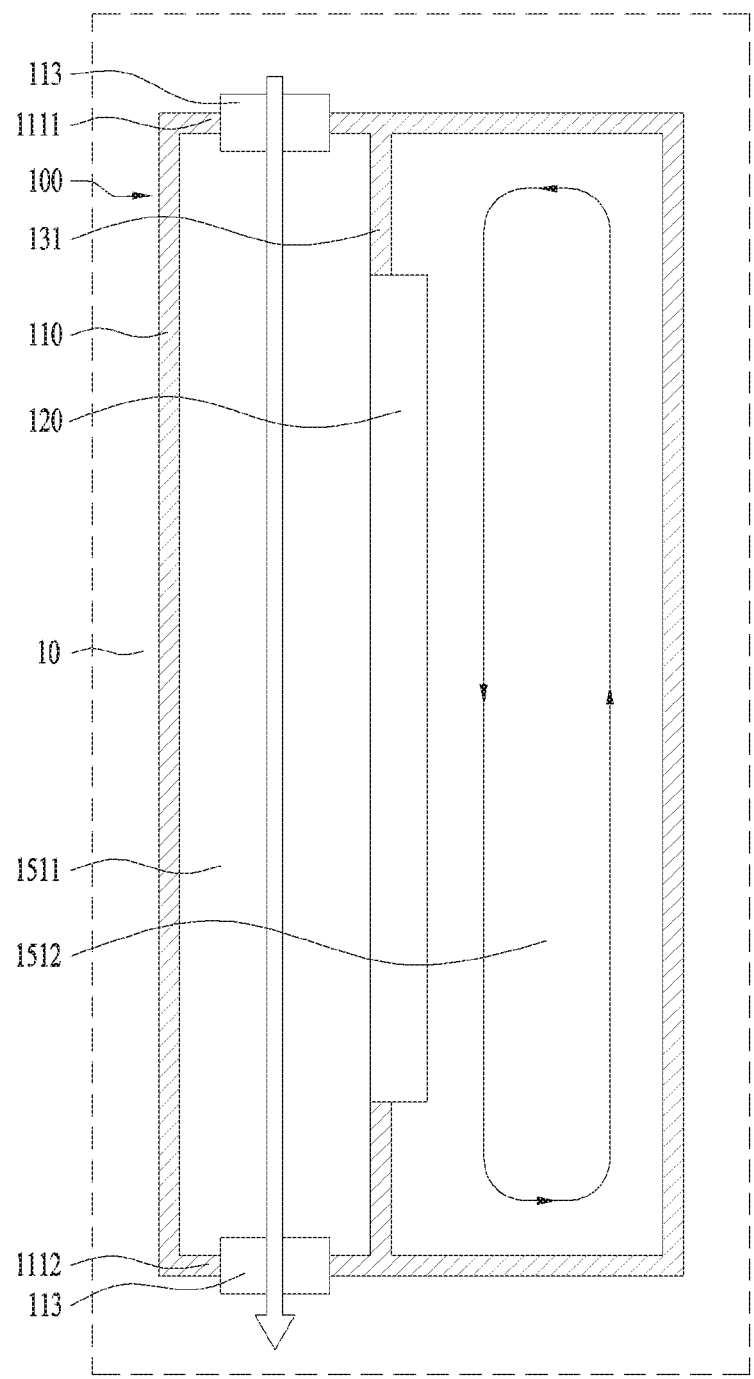
FIG. 2 is a sectional conceptual diagram illustrating another embodiment of a display device in accordance with the present disclosure.

FIG. 2 is a sectional conceptual diagram illustrating another embodiment of a display device 100 in accordance with the present disclosure.

The present embodiment is similar to the embodiment of FIG. 1, except that the front surface space 1511 is exposed to the external space 10. Using that the direct cooling which allows a medium to be mixed with the external space 10 is more efficient than the indirect cooling which transmits only heat, the direct cooling may be performed for the front surface of the display module 120 where relatively much heat is generated.

The outer case 110 may include an inlet 1111 for sucking external air into a front open space 1513 and an outlet 1112 for exhausting the air.

The inlet 1111 and the outlet 1112 may be provided in positions which are spaced a sufficient distance from each other for smooth air flow. For example, in case the inlet 1111 is provided in a left lateral surface of the outer case 110, the outlet 1112 may be provided in a right lateral surface of the outer case 110. Accordingly, an internal space of the front surface space 1511 is able to be affected by the air flow as much as possible.

Meanwhile, the air density through temperature differences may be put into consideration. Using a physical property that warm air rises while cold air falls, the inlet 1111 may be provided in a lower end and the outlet 1112 in an upper end of the outer case 110 provided in the display device 100.

The inlet 1111 and the outlet 1112 may generate natural convection based on an air density difference caused by different temperatures or be forcibly convected by a fan.

It is necessary to prevent dust inlet to the external space 10 in the respect that air is drawn into the front surface space 1511 from the external space 10. Accordingly, a foreign-substances-preventing filter 113 may be provided in the inlet 1111 or the outlet 1112.

Figure 3:
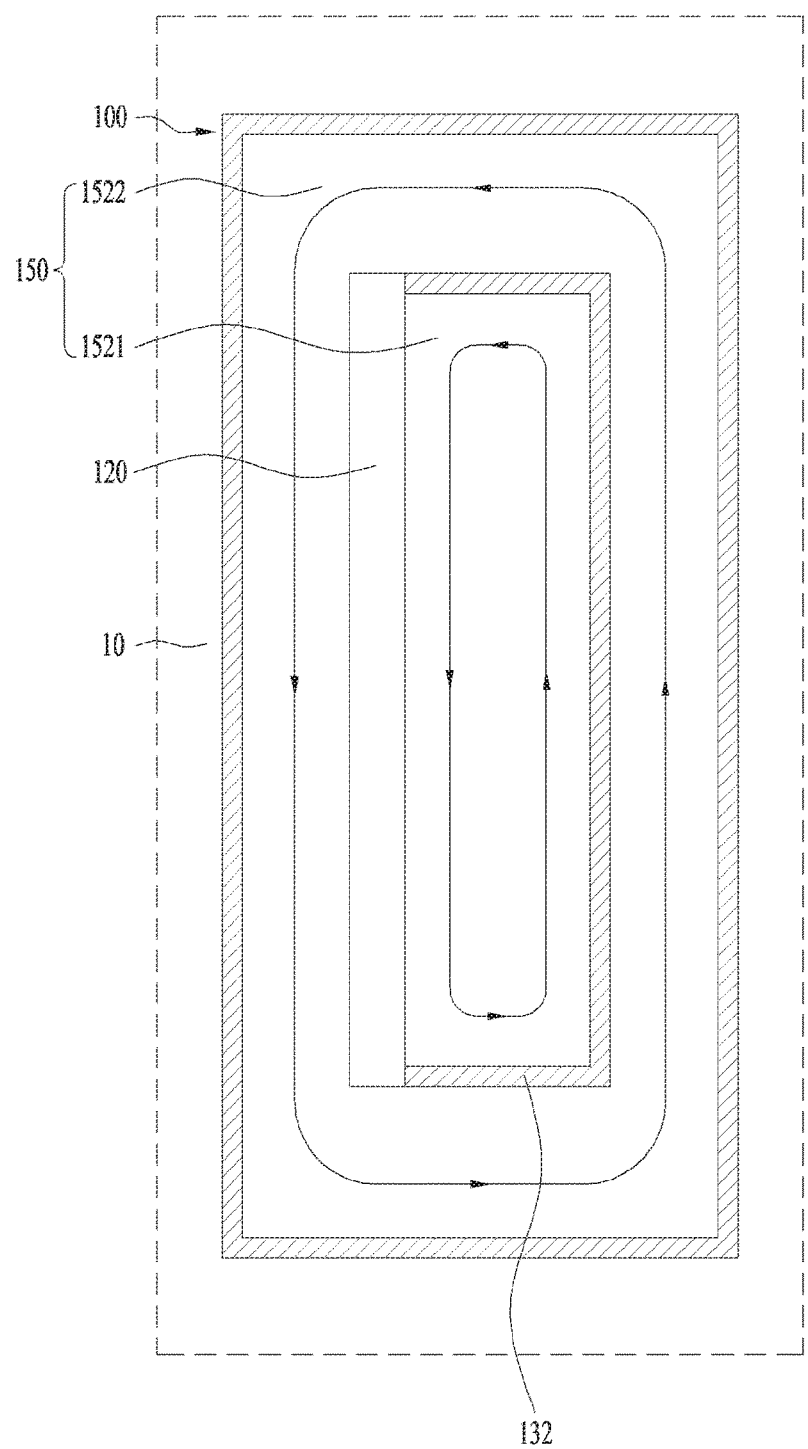
FIG. 3 is a sectional conceptual diagram illustrating a further embodiment of a display device in accordance with the present disclosure.

FIG. 3 is a sectional conceptual diagram illustrating a further embodiment of a display device 100 in accordance with the present disclosure.

Different from the embodiment of FIG. 1, the present embodiment shows that the first closed space 1521 is surrounded by the second closed space 1522 and such surrounding may be realized by the inner case 132.

The display module 120 is mounted in the internal space 150 defined by the outer case 110 and the inner case 132 divides the internal space into the first closed space 1521 and the second closed space 1522, while the first closed space 1521 is surrounded by the second closed space 1522.

In case the second closed space 1522 surrounds the first closed space 1521, the second closed space 1522 may occupy relatively much area of the internal space 150 defined by the outer case 110. When the heat generated in the front surface of the display module 120 is much more than the heat generated in the rear surface, it is preferred to enhance the heat radiation efficiency of the second closed space 1522 as descried in the present embodiment.

The heat radiation of the second closed space 1522 is realized by the direct heat exchange with the external space 10, through the relatively large area mentioned above, only to improve the heat radiation performance.

The inner case 132 is coupled to the display module 120 and partitions off the internal space into the second closed space 1522 and the first closed space 1521 so that the second closed space 1522 may surround the first closed space 1521.

The second closed space 1522 may form a closed loop which circulates around the first closed space 1521. In other words, the air which forms the closed loop disperses heat while circulating an outer region of the display device 100 and radiates heat to the external space 10 simultaneously to improve the heat radiation efficiency.

The characteristic is applicable not to an entire 3-dimensional area of the display device 100 commonly but some area. For example, the characteristic of FIG. 3 shows one longitudinally cross section area or one horizontally cross section area of the display device 100, or illustrates that the first closed space 1521 relates to one longitudinally cross section area and the second closed space 1522 relates to one horizontally cross section area. In other words, only presence of airtight closure and an air circulation tendency between the spaces are shown, not the precise one cross section area.

Figure 4:
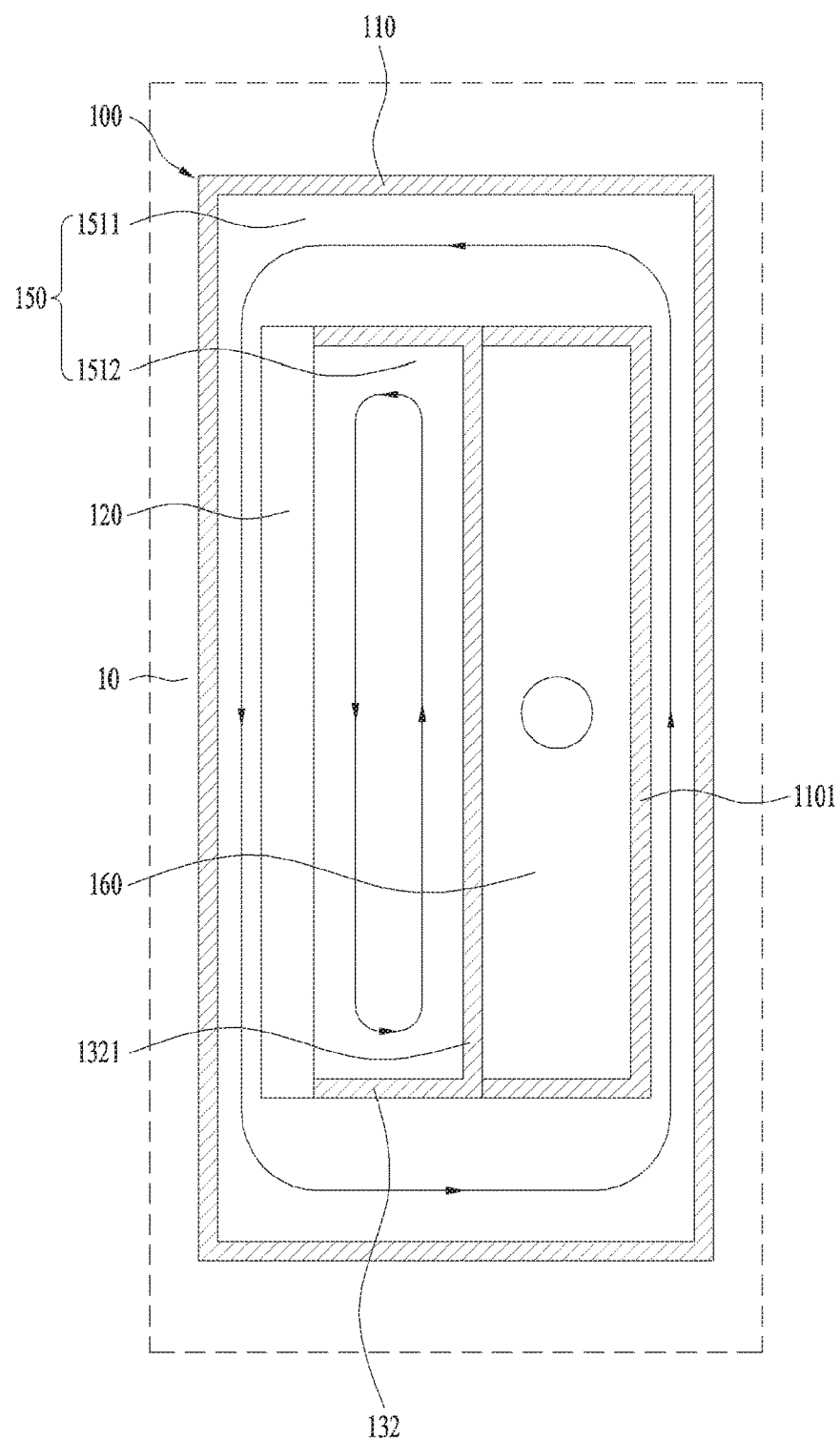
FIG. 4 is a sectional conceptual diagram illustrating a still further embodiment of a display device in accordance with the present disclosure.

FIG. 4 is a sectional conceptual diagram illustrating a still further embodiment of a display device 100 in accordance with the present disclosure.

In the embodiment of FIG. 3, only the air of the second closed space 1522 is able to directly radiate heat to the external space 10 and the air of the first closed space 1521 is not able to radiate heat to the external space 10 but indirectly radiate heat, using the second closed space 1522.

When provided with much heat, the first closed space 1521 radiates heat to the second closed space 1522, not the external space 10. Accordingly, an inefficient heat radiation effect might occur.

To solve the disadvantage, the embodiment of FIG. 4 suggests a structure that the first closed space 1521 surrounded by the first closed space 1522 is also able to perform direct heat exchange with the external space 10.

A first open hole 160 is configured to form an outer passage which is connected to the external space 10 and the first open hole 160 may be provided in the display device 100.

The first open hole 160 penetrates the display device 100 and is divided from the internal space 150. In other words, the first open hole 160 may be formed by a first region 1101 of an outer surface of the outer case 110 and a second region 1321 of an outer surface of the inner case 132.

The first open hole 160 passes between the first closed space 1521 and the second closed space 1522. Accordingly, the air of the first closed space 1521 radiates heat to air of the outer passage passing through the first open hole 160 and the air of the second closed space 1522 radiates heat to air of the outer passage passing through the first open hole 160 and air of the external space 10, not the first open hole 160.

Together with the advantage of the embodiment shown in FIG. 3, the present embodiment is capable of directly radiating the heat of the first closed space 1521 to the external space 10 and then radiating the heat generated over the entire region of the display device efficiently.

That characteristic can be checked through the area where the display 100 is directly exposed to the external space 10. While only the region of the outer case 110 which for forming the second closed space 1522 is exposed to the external space 10 in the embodiment of FIG. 3, another region of the first open hole 160 as well as the region for the second closed space 1522 is exposed to the external space 10 in the embodiment of FIG. 4.

An outer fan may be provided to form a sufficient velocity of the external air passing through the first open hole 160. The forcible convection caused by the outer fan may form an inlet and an outlet of the first hole 160.

All of the open holes which will be described hereinafter may facilitate natural convection without any auxiliary fans or forcible convection with at least one auxiliary fan. The outer fan is employed to form air flow in the external space 10 of the display device 100, which is distinguished from an inner fan which will be described later.

FIGS. 5 through 8 are diagrams illustrating one example of the display device 100 which specifically realize the embodiment of FIG. 4.

Figure 5:
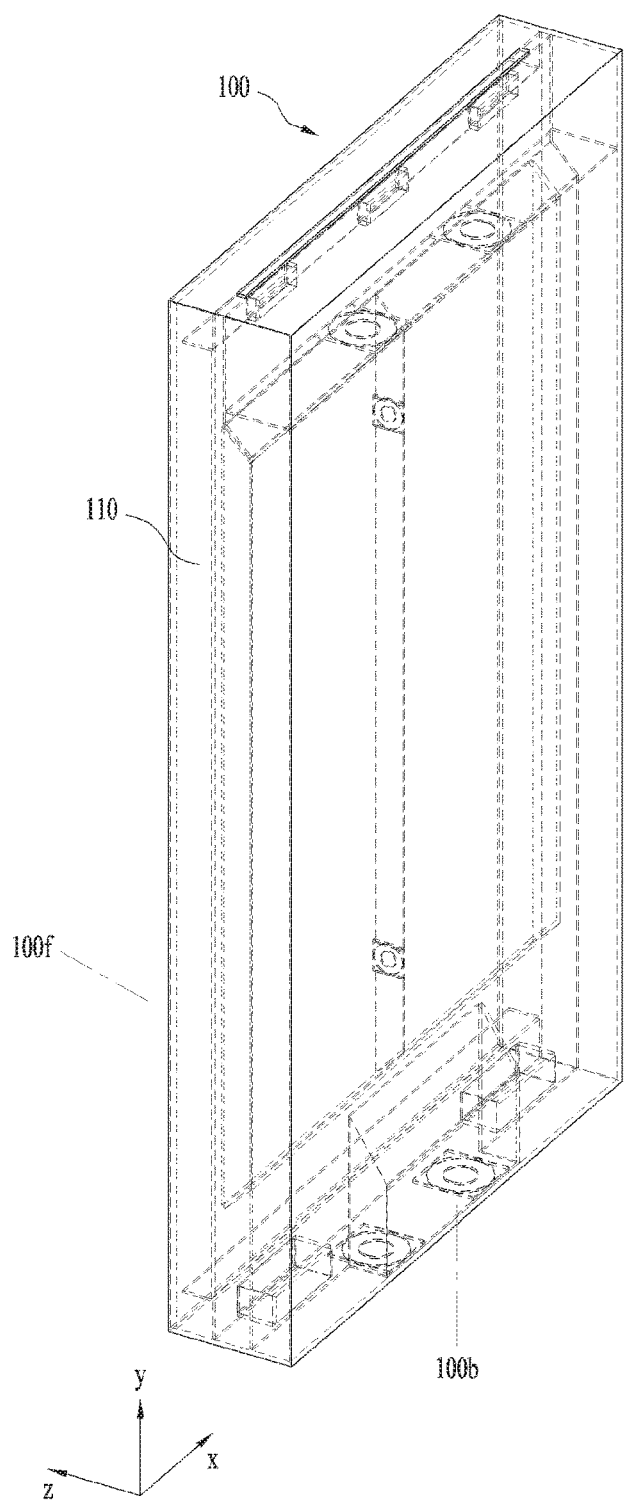
FIGS. 5 through 8 are diagrams illustrating one example of the display device which specifically realize the embodiment of FIG. 4.
Figure 6:
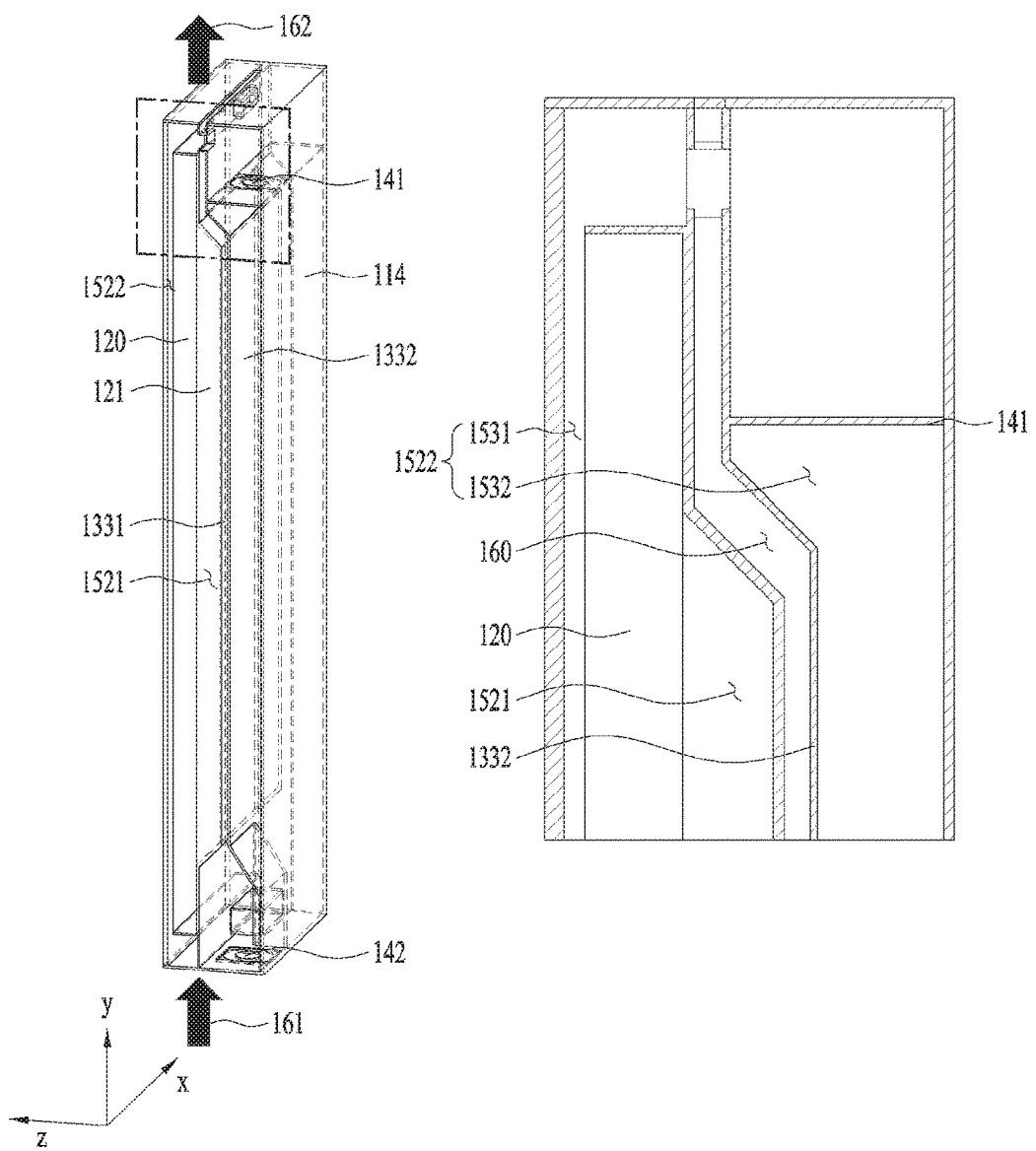
Figure 7:
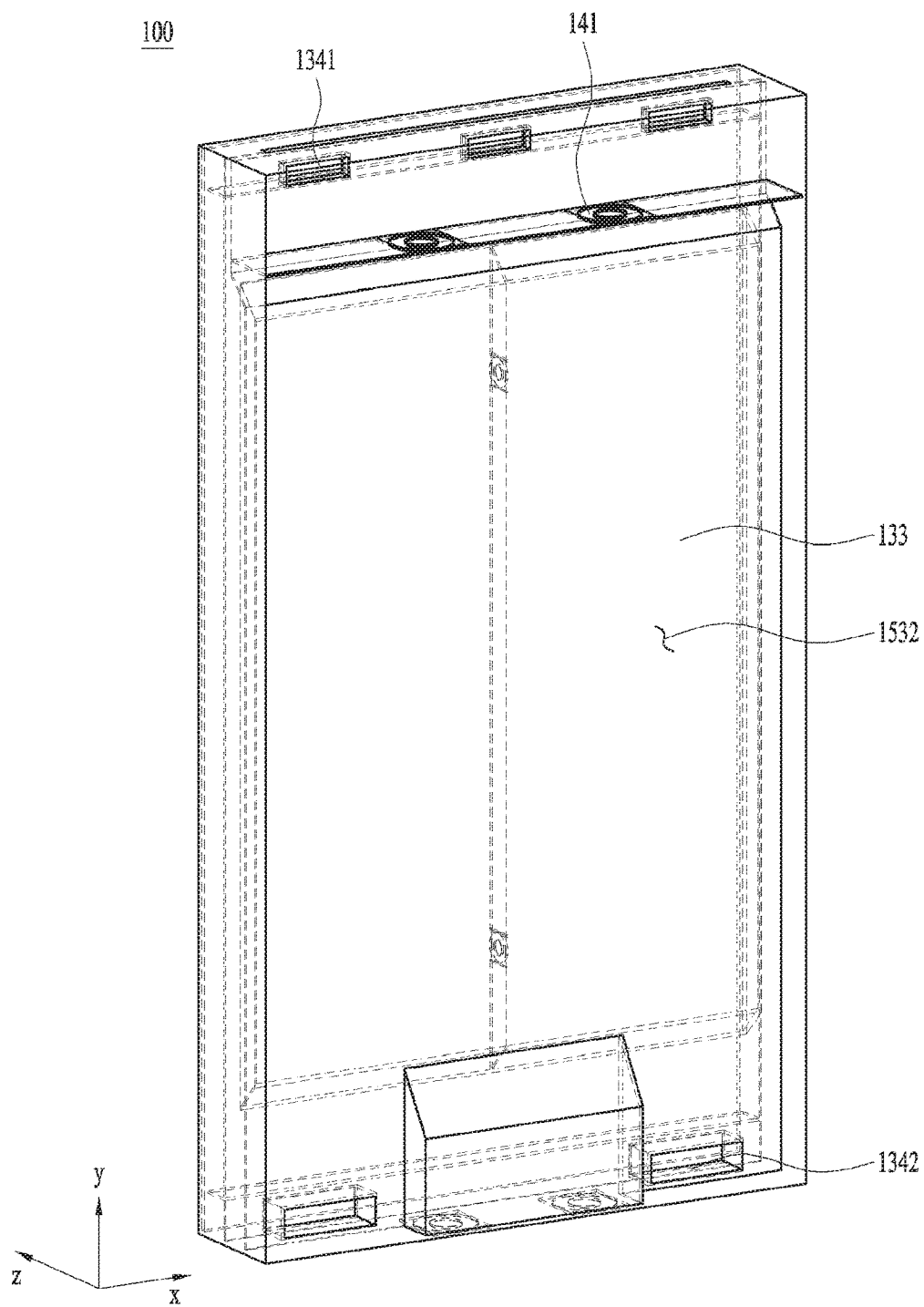
Figure 8:
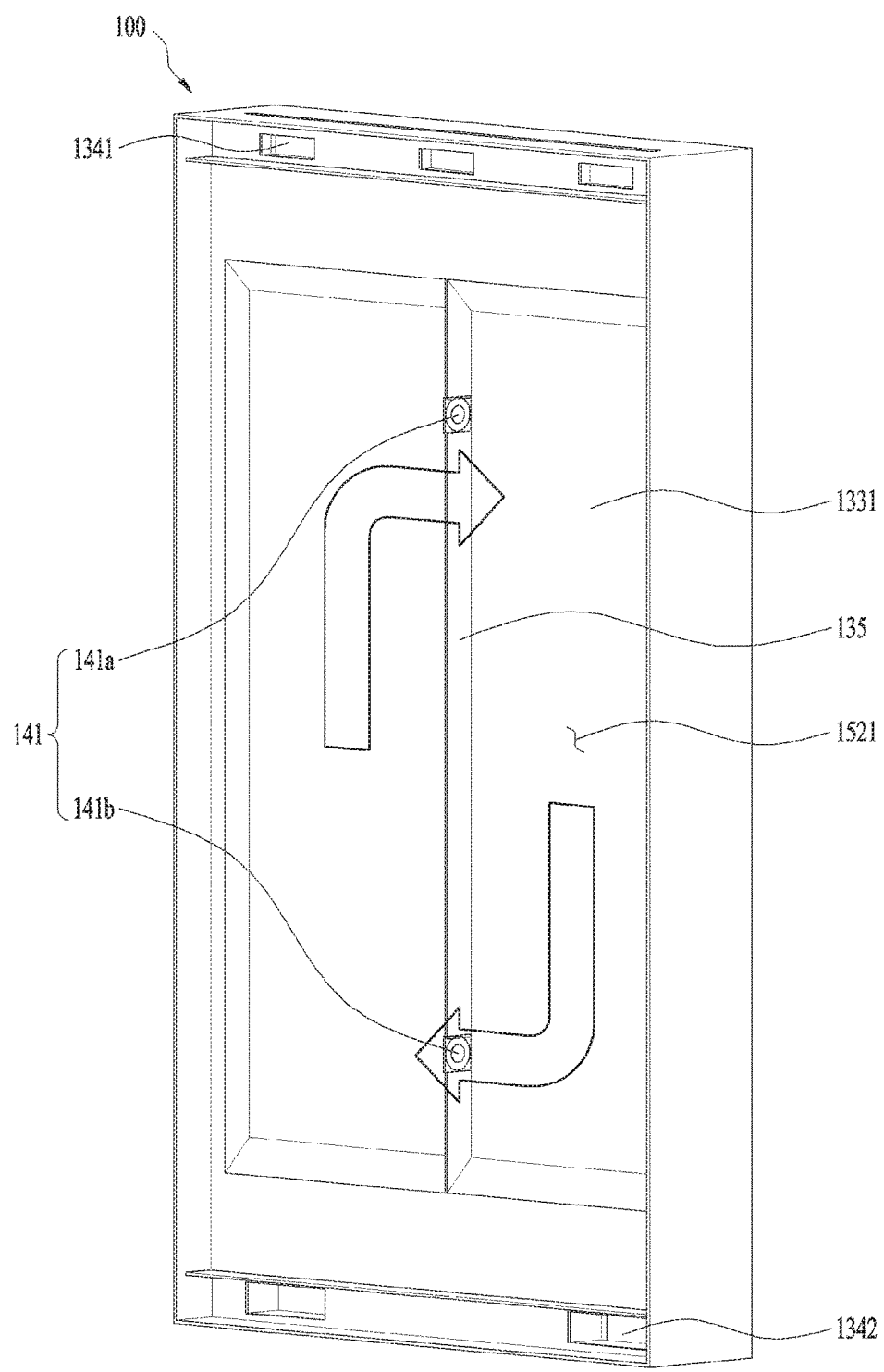

FIG. 5 is a rear perspective diagram of the display device 100. FIG. 6 is a sectional diagram along A-A' of FIG. 5. FIG. 7 is a diagram illustrating a state where a rear frame is removed from the example of the display device. FIG. 8 is a diagram illustrating a state where a front frame and the display module 200 are removed from the display device 100.

The display device 100 may have a polygonal shape. In other words, the outer case 110 of the display device 100 has an exterior defined by a plurality of outer surfaces which are toward different directions, respectively.

One surface of the display device 100 having the display is defined as a front surface of the display device 100. Another surface which supports the display device 100 with respect to the floor is defined as a lower surface of the display device 100.

An inlet 1601 and an outlet 1602 of the first open hole 161 may be formed in one surface and/or another surface of plural outer surfaces possessed by the outer case 110, respectively. In case the inlet 1601 and the outlet 1602 are provided in surfaces of the outer case, respectively, the possibility that the air exhausted from the outlet 1602 after receiving heat will be drawn into the inlet 1601 again may be minimized.

Especially, the inlet 1601 and the outlet 1602 of the first open hole 161 may be linearly formed in one surface of the outer case 110 and the other surface facing the surface. Refrigerant is able to pass the first open hole 161 penetrating the surface and the other one quickly and it is possible to minimize the turbulent flow which might be generated by a complex appearance.

An outer fan 142 is provided on the first open hole 161 so as to realize forcible convection.

More specifically, when the inlet of the first open hole 161 is provided in a lower surface of the display device 100 and the outlet 1602 thereof is provided in an upper surface of the display device 100, an effect of natural convection that heated air tends to rise is added and a higher heat radiation efficiency is able to be achieved.

A backlight unit is provided in an LCD display module 120 and a backlight frame 131 is provided to mount backlights therein and protect them simultaneously and define the final exterior of the display module 120.

A first middle frame 1331 is provided in a rear surface of the display module 120 or a rear surface of the backlight frame 121 and configured to form a front surface region of the first open hole 160. A second middle frame 1332 may be provided in the outer case 110.

In other words, the first middle frame 1331 may function as a predetermined portion of the second region 1321 provided in the inner case 132 and the second middle frame 1332 as the first region 1101 of the outer case 110.

The first open hole 160 is partitioned off from the internal space 150 by the first middle frame 1331 and the second middle frame 1332.

Electronic components of the display device 100 such as the drive unit and the control unit may be provided between the backlight frame 121 and the first middle frame 1331 or between the second middle frame 1332 and a back frame 114.

As occasion occurs, the backlight frame 121 functions as the first middle frame 1331 so that the rear surface of the backlight frame 121 can be directly exposed to the external space 10 of the first open hole 160.

The first open hole 160 may be formed over a broad area to exchange heat with the rear region of the display module 120.

As the heat generation region of the display module rear surface caused by the backlight unit is broad, the first open hole 160 is also formed broad so as to radiate the generated heat to the external space 10 of the first open hole 160 effectively.

More specifically, the first and second middle frames 1331 and 1332 for forming the external space 10 of the first open hole 160 may be spread wide with respect to an x-y plane which is a display plane of the display device 100.

The inlet 161 of the first open hole 160 may have a sufficient width in a back-and-forth direction to secure some space for the outer fan 142.

A cross section of the inlet 161 formed in the first open hole 160 is equal to a cross section of the backlight region not to interfere with the air passing through the first open hole 160.

When the first and second middle frames 1331 and 1332 are formed from one end to the other end of the outer case 110 provided in the display device 100 to form the first open hole 160, an upper end through-hole 1341 and a lower end through-hole 1342 may be further provided to form a closed loop.

The second closed space 1522 may form a closed loop which circulates around the first closed space 1521.

The heat generated in the front surface of the display module 120 is transmitted to air inside the front surface space 1531 of the display device 100 and the air provided with the heat is drawn into the rear surface space 1532 of the display device 100 via the through-hole 1342 provided in an upper end or lower end. The drawn air exchanges heat with the air inside the external space 10 of the rear surface of the display device 100 and the air inside the external space passing through the first open hole 160 simultaneously to perform quick heat radiation.

The heat-radiated air passes through the other through-hole 1341 provided in the upper or lower end of the middle frame 133 and enters the front surface space 1531 of the display device 100 again, only to form the closed loop. The display device 100 may include an inner fan 141 provided in a predetermined region of the second closed space 1522.

When the temperature in the front surface space 1531 of the display device 100 is higher than the temperature in the rear surface space 1532 of the display device 100, the air inside the front surface space 1531 of the display device may be naturally convected to the upper end through-hole.

Accordingly, it is preferred in terms of heat radiation efficiency that the inner fan 141 is provided in the direction of air flow in an order of the front surface space 1531, the upper end through-hole 1341, the rear surface space 1532 and the lower end through-hole 1342 to forcibly convect the air.

It is difficult to form a spare space between the front surface of the display module 120 and the front surface of the display device 100 so that the inner fan 141 may be provided in the rear surface space 1532 of the display device 100.

The first closed space 1521 may be formed between the first middle frame 1331 and the backlight frame 121 of the display module 120. The first closed space 1521 is provided with the heat generated in the backlight unit via the backlight frame 121 and radiates the heat to the external space 10 of the first open hole 160.

When the drive unit or the control unit is provided in the first closed space 1521, the heat generated in the drive unit or the control unit may be radiated to the external space 10 of the first open hole 160.

A circulation bracket 135 and the inner fan 141 may be provided in the first closed space 1521 so as to form a closed loop.

In case the first closed space 1521 has a shape with a thin width and a broad area, the closed loop may be a circular shape in parallel with the front surface. For the configuration of the closed loop, the circulation bracket 135 located across the first closed space 1521 and the inner fan 141 located in the circulation bracket 135 may be provided. For example, when the circulation bracket 135 is provided in a longitudinal direction, two inner fans 141 may be over and under the circulation bracket 135. When the inner fan 141 provided in an upper portion forms air flow from a left direction to a right direction, the inner fan 141 provided in a lower end region may form air flow from the right direction to the left direction. Accordingly, the entire region of the first closed space 1521 may be one loop.

In case the inner fan 141 is provided in the first closed space 1521 to circulate air, the heat generated in the first closed space 1521 may not be concentrated.

Figure 9:
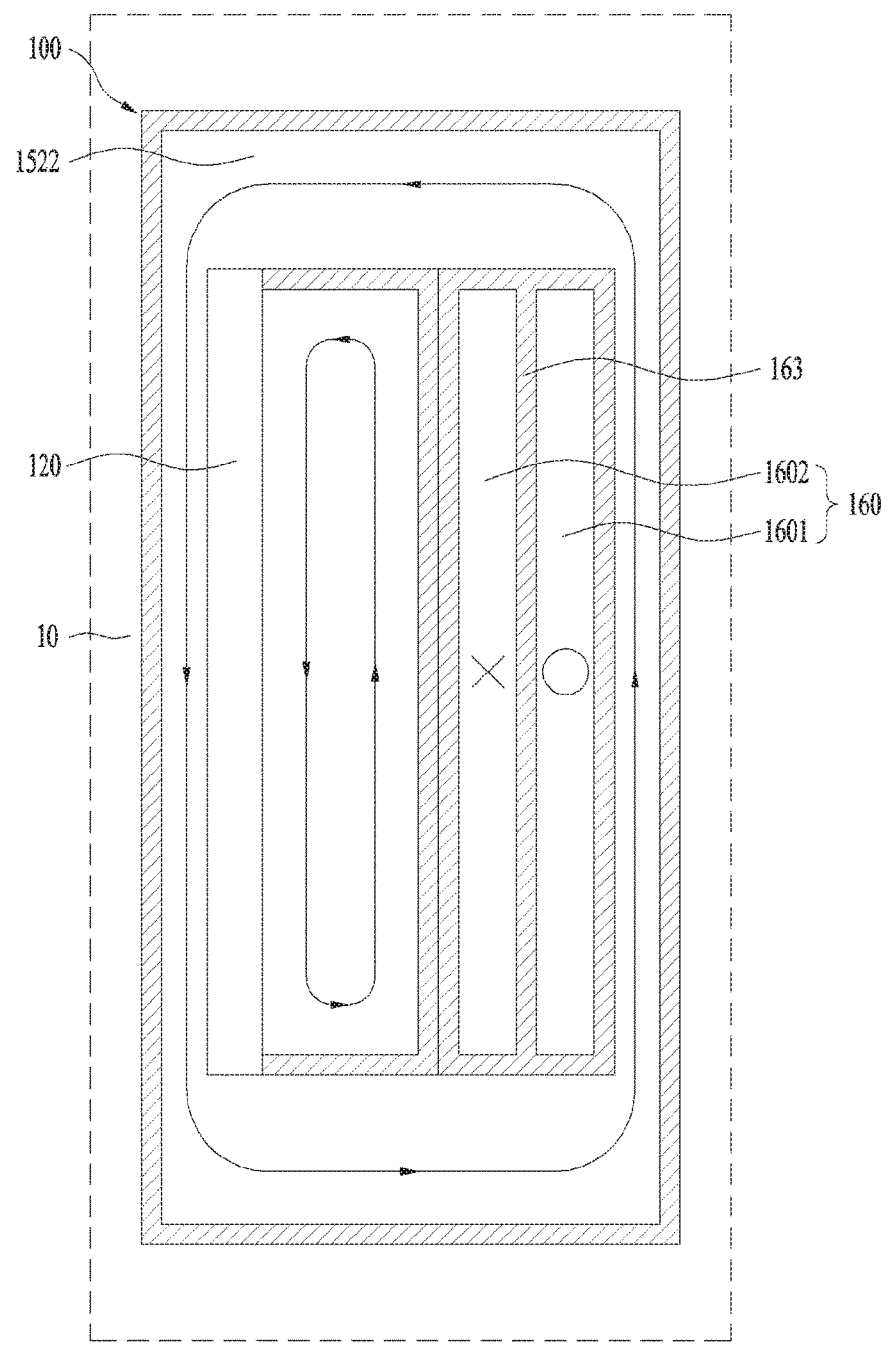
FIG. 9 is a conceptual diagram illustrating a still further embodiment of a display device in accordance with the present disclosure.

FIG. 9 is a conceptual diagram illustrating a still further embodiment of a display device 100 in accordance with the present disclosure.

In the display device 100 shown in FIGS. 4 through 8, the inlet 161 and the outlet 162 of the first open hole 160 are toward different directions. In other words, the inlet 161 of the first open hole 160 is formed in one of outer surfaces of the display device 100, of which each is toward a different direction, and the outlet 102 is formed in another one of the outer surfaces.

However, in embodiment of the display device 100 shown in FIG. 9, the inlet and the outlet of the first open hole 160 may be formed in one surface of the outer surfaces.

When the inlet 161 and the outlet 162 of the first open hole 160 are provided in one same surface, the entire path of the first open hole 160 is able to be formed long in a relatively small area advantageously.

The first open hole 160 may be divided into a first heat radiation portion 1601 as one path and a second heat radiation portion 1602 as the other path by the partition bracket 164.

Air flows in the first heat radiation portion 1601 in a first direction and air flows in the second heat radiation portion 1602 in a second direction.

For easy description sake, an outlet direction of the air flow with respect to one cross section is referred to as 'O' and an inlet direction of the air flow is referred to as 'X'. When the first heat radiation portion 1601 has 'O air flow' and the second heat radiation portion 1602 has 'X air flow' as shown in FIG. 9, the first and the second direction are in reverse.

Unless mentioned additionally, the characteristics of the display device 100 161 are equal to those of the display device described in the embodiments of FIGS. 4 through 8.

Figure 10:
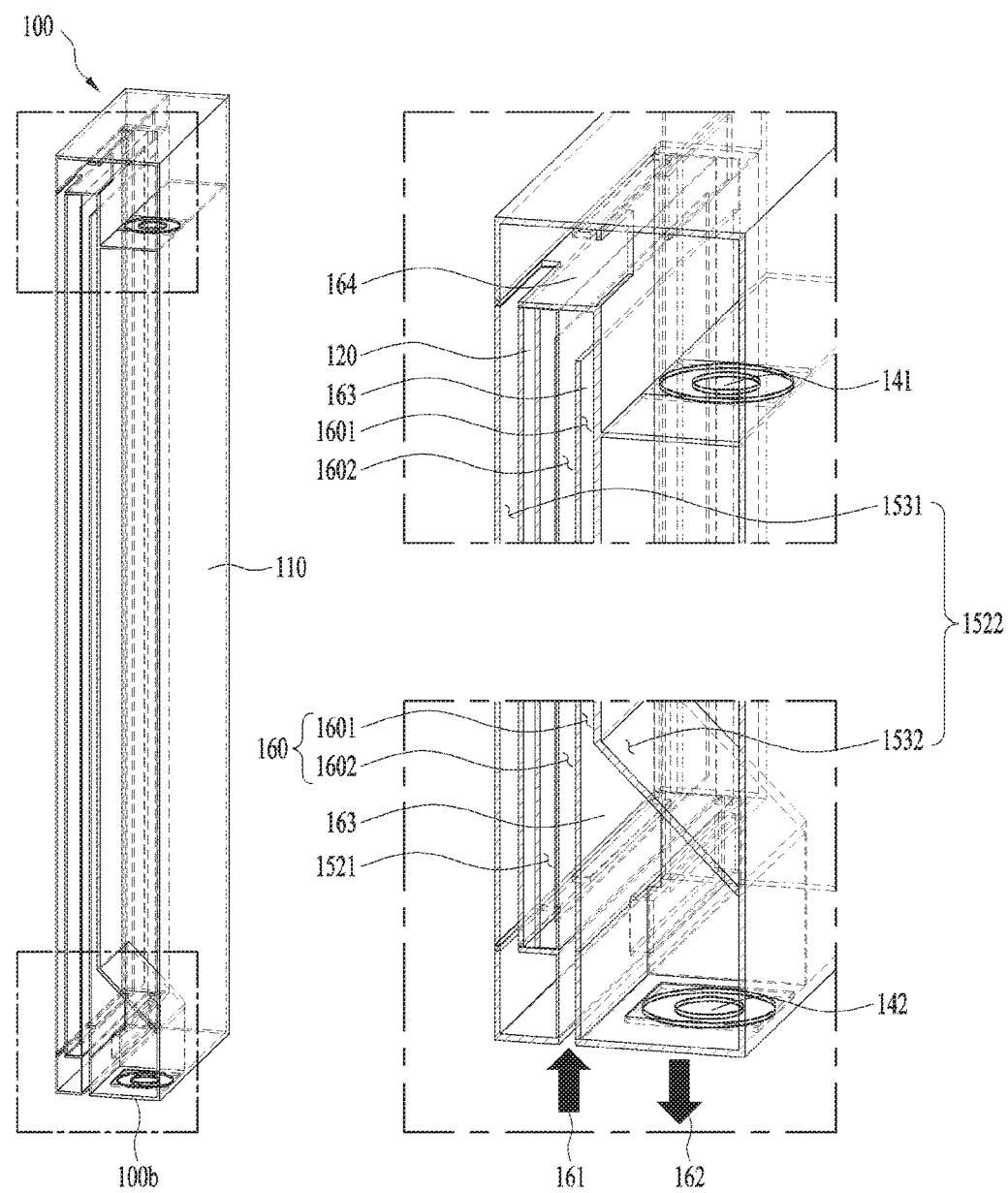
FIG. 10 is a diagram illustrating one example of a display device which specifically realize the embodiment of FIG. 9.
Figure 11:
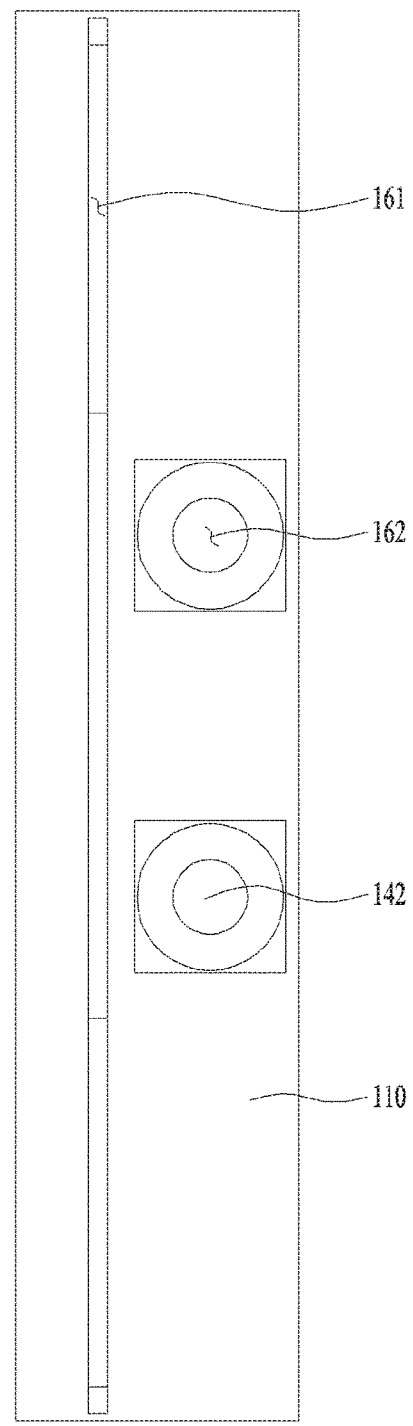
FIG. 11 is a diagram illustrating another example of a display device which specifically realize the embodiment of FIG. 9.

FIGS. 10 and 11 are diagrams illustrating one example of a display device 100 which specifically realize the embodiment of FIG. 9.

FIG. 10 is a longitudinally sectional diagram of the display device 100 and FIG. 11 is a lower cross sectional diagram of the display device 100.

The display device 100 of the present embodiment is similar to that of the embodiments shown in FIGS. 4 through 8, except features which will be described additionally, referring to FIGS. 10 and 11.

The inlet 161 and the outlet 162 of the first open hole 160 may be provided on surface of the display device 100, especially, a lower surface of the display device 100.

Alternatively, the inlet 161 and the outlet 162 of the first open hole 160 may be provided in a first region and a second region, respectively, which are adjacent to each other on the same surface.

The partition bracket 164 partitions off the first open hole 160 into the inlet 161 and the outlet 162. The air having passed the inlet 161 of the first open hole 160 rises to an upper end and then it is bent toward the outlet 162 of the first open hole 160 to be exhausted.

In case heat conductivity is high in the partition bracket 164, the partition bracket 164 functions as a heat radiation plate for radiating the heat generated in the display device 100 so that it may broaden an overall surface area to help an effective heat radiation.

In case the inlet 161 and the outlet 162 of the first open hole 160 are provided in the lower surface of the display device 100, the foreign substances of the external space 10 such as dust which might be drawn into the inlet 161 may be minimized.

In case the inlet 161 and the outlet 162 of the first open hole 160 are provided in the lower surface of the display device 100, it is preferred that the inlet 161 of the first open hole 160 is provided in the front surface space 1531 or the rear surface region 1532 of the display device 100 based on the amount of the heat, in other words, in the region where more heat is generated. It is effective in the heat radiation efficiency to make the direction of the forcible convection which is raised by the outer fan 142 be equal to the direction of the natural convection which is raised by relatively hot air.

For example, when much heat is generated in the display module 120, the inlet 161 of the first open hole 160 may be inclined toward the front surface space 1531 which is closer to the display module than the outlet 162 of the first open hole 160.

Although not shown in the drawings, the outlet 162 of the first open hole 160 may be inclinedly closer to the front surface space 1531 than the inlet 161. The locations of the inlet 161 and the outlet 162 may be changed, in case the outer fan 142 is provided in the inlet 161 or the outlet 16 or the rotational direction of the fan is changed.

A guide bracket 164 is configured to guide the air flow of the first open hole 160. Especially, in the present embodiment, the guide bracket 164 guides air flow in the region where the air flow is changed from the first heat radiation portion 1601 to the second heat radiation portion 1602.

The entire first open hole 160 together with the guide bracket 164 and the partition bracket 163 may form a '⊏'-shaped passage. The ⊏-shape may become one example possessed by the first open hole bent once, with a high heat radiation efficiency.

Figure 12:
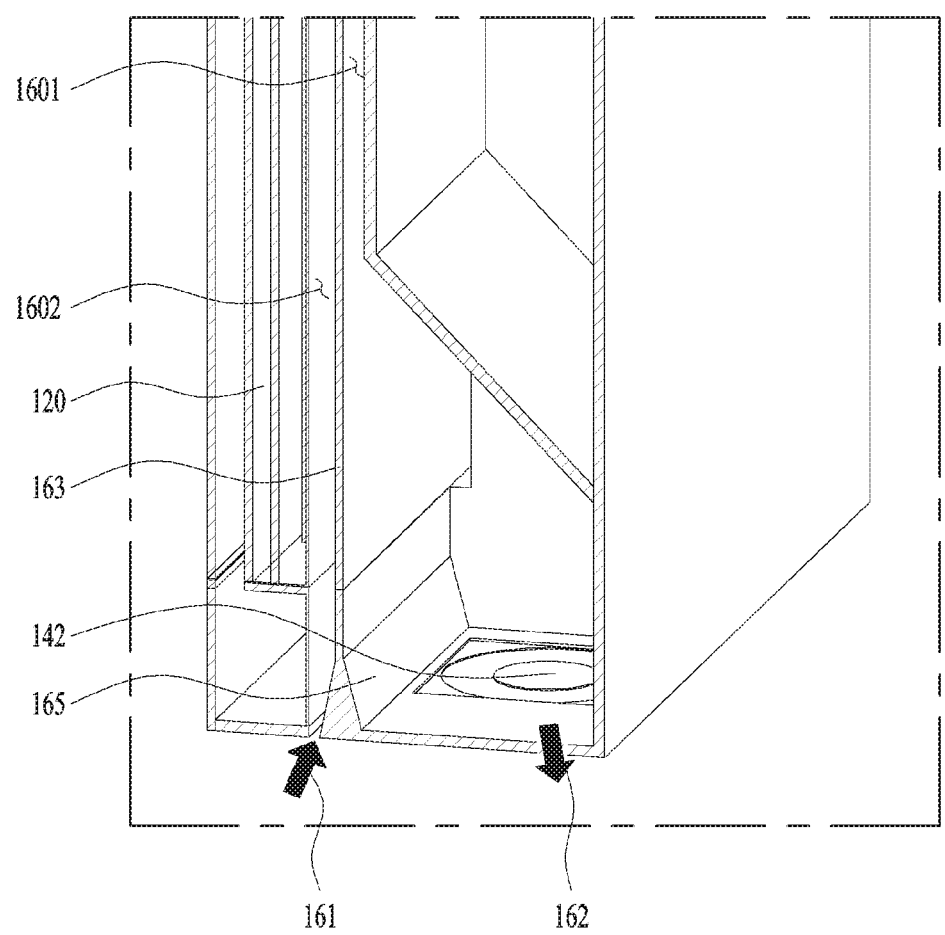
FIG. 12 is a conceptual diagram illustrating a still further embodiment of a display device in accordance with the present disclosure.

FIG. 12 is a conceptual diagram illustrating a still further embodiment of a display device 100 in accordance with the present disclosure;

In case the inlet 161 and the outlet 162 of the first open hole 160 are provided in the same surface of the display device 100 as described in the embodiment of FIG. 11, especially, the inlet 161 is provided adjacent to the outlet 162, the heated air exhausted via the outlet 162 is not radiated to the external space 10 but drawn into the inlet 161 again disadvantageously.

To prevent such re-drawing of air, the partition bracket 163 may include a branched bracket 165 for widening and angle between a direction of the inlet 161 and a direction of the outlet 162 of the first open hole 160. The branched bracket 165 has a direction toward the inlet 161 and another direction toward the outlet 162 which are different from each other from the external space 10. For example, the branched bracket 165 is configured to adjust the air inlet direction and the air outlet direction to make the direction toward the inlet 161 be perpendicular to the direction toward the outlet 162 in the external space 10.

Although not described in the embodiment, the locations of the inlet 161 and the outlet 162 may be variable based on necessity.

Figure 13:
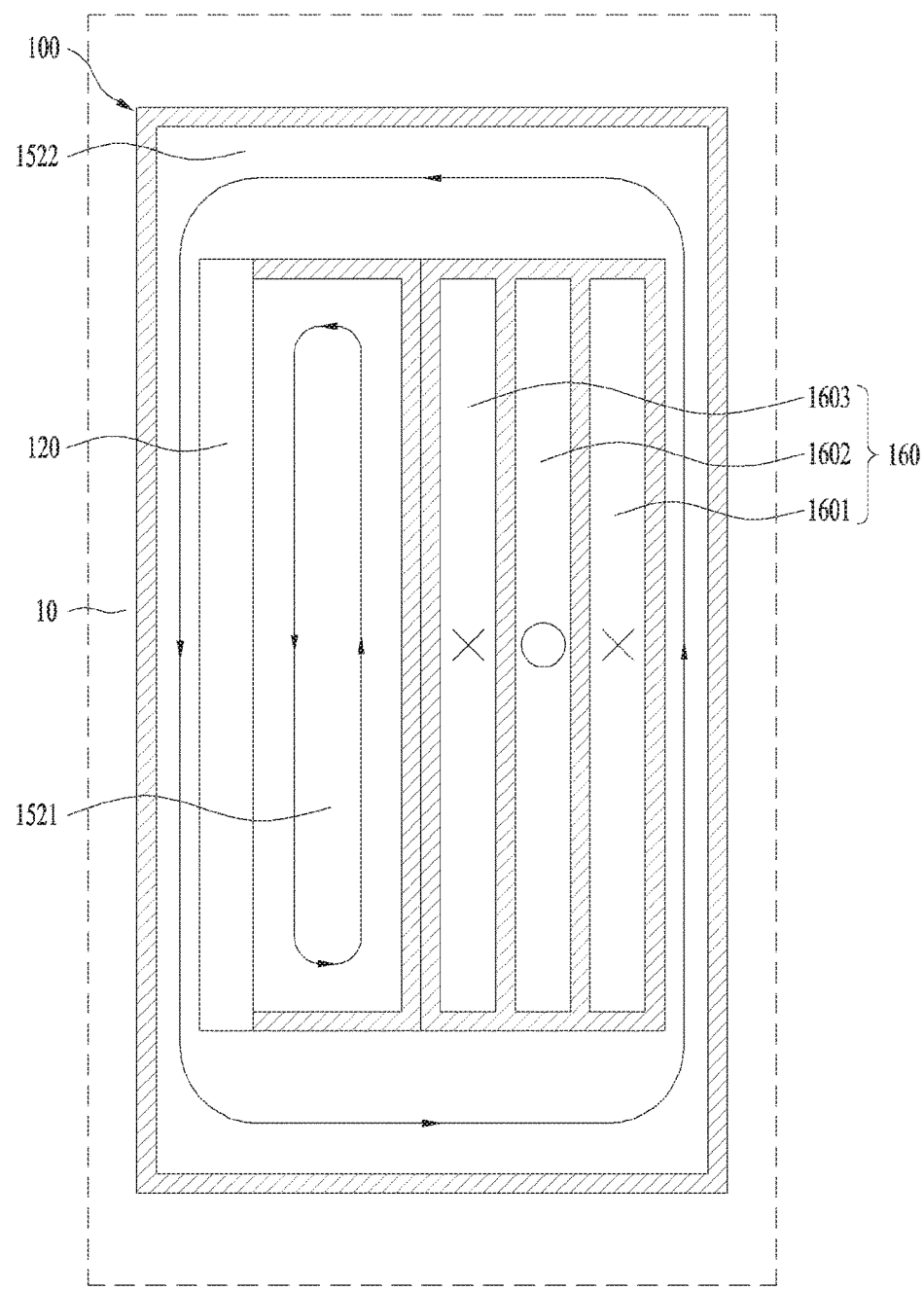
FIG. 13 is a conceptual diagram illustrating a still further embodiment of a display device in accordance with the present disclosure.

FIG. 13 is a conceptual diagram illustrating a still further embodiment of a display device 100 in accordance with the present disclosure.

In the embodiments mentioned above, the first open hole 160 is formed in one direction or bent one time to form the inlet 161 and the outlet 162 in the same surface.

Meanwhile, the embodiment of FIG. 13 shows that the first open hole 160 is bent at least two times. Accordingly, the inlet 161 and the outlet 62 of the first open hole 160 are provided in different surfaces of the display device 100, respectively, so that the possibility of re-drawing the air exhausted via the outlet 162 of the first open hole 160 to the inlet 161 may be minimized.

As one example, the first open hole 160 may have an 'S'-shaped passage.

The two-times-bent passage of the first open hole 160 may include a first heat radiation portion 1601, a second heat radiation portion 1602 and a third heat radiation portion 1603 as three region passages. The tree region passages may be provided adjacent to each other. Especially, the first heat radiation portion 1601, the second heat radiation portion 1602 and the third heat radiation 1603 may be located close to each other.

Figure 14:
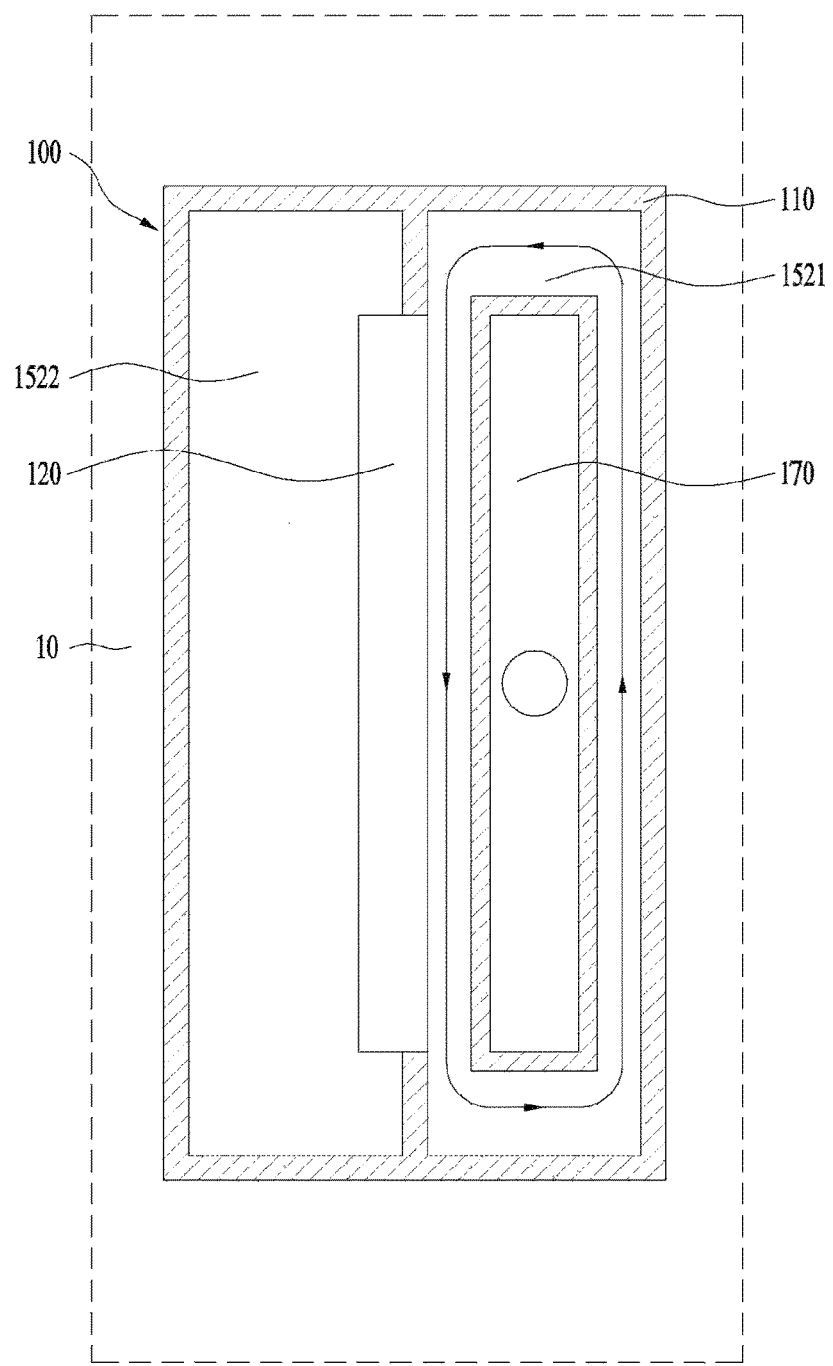
FIG. 14 is a conceptual diagram illustrating a still further embodiment of a display device in accordance with the present disclosure.

FIG. 14 is a conceptual diagram illustrating a still further embodiment of a display device 100 in accordance with the present disclosure.

For easy description sake, one open hole which is distinguished from the first open hole 160 is defined as a second open hole 170.

The second open hole 170 may also form an outer passage which penetrates the display device 100. The second open hole 170 may be formed by a third region formed in an outer surface of the outer case 110.

Different from the embodiment of FIG. 4 showing that the first open hole 160 is surrounded by the first closed space 1521 and the second closed space 1522, the embodiment of FIG. 14 shows that a second open hole 170 is surrounded only by the first closed space 1521 to form a closed loop. In other words, the air inside the second closed space 1522 provided with the heat generated in the front surface of the display module 120 is radiated via the front surface of the display device 100 and the air inside the first closed space 1521 provided with the heat generated in the rear surface of the display module 120 may be radiated to the external space 10 of the display device 100 and the external space 10 of the second open hole 170 via the closed loop.

The second open hole 170 having the characteristic is capable of broadening the heat radiation area of the first closed space 1521 advantageously.

Figure 15:
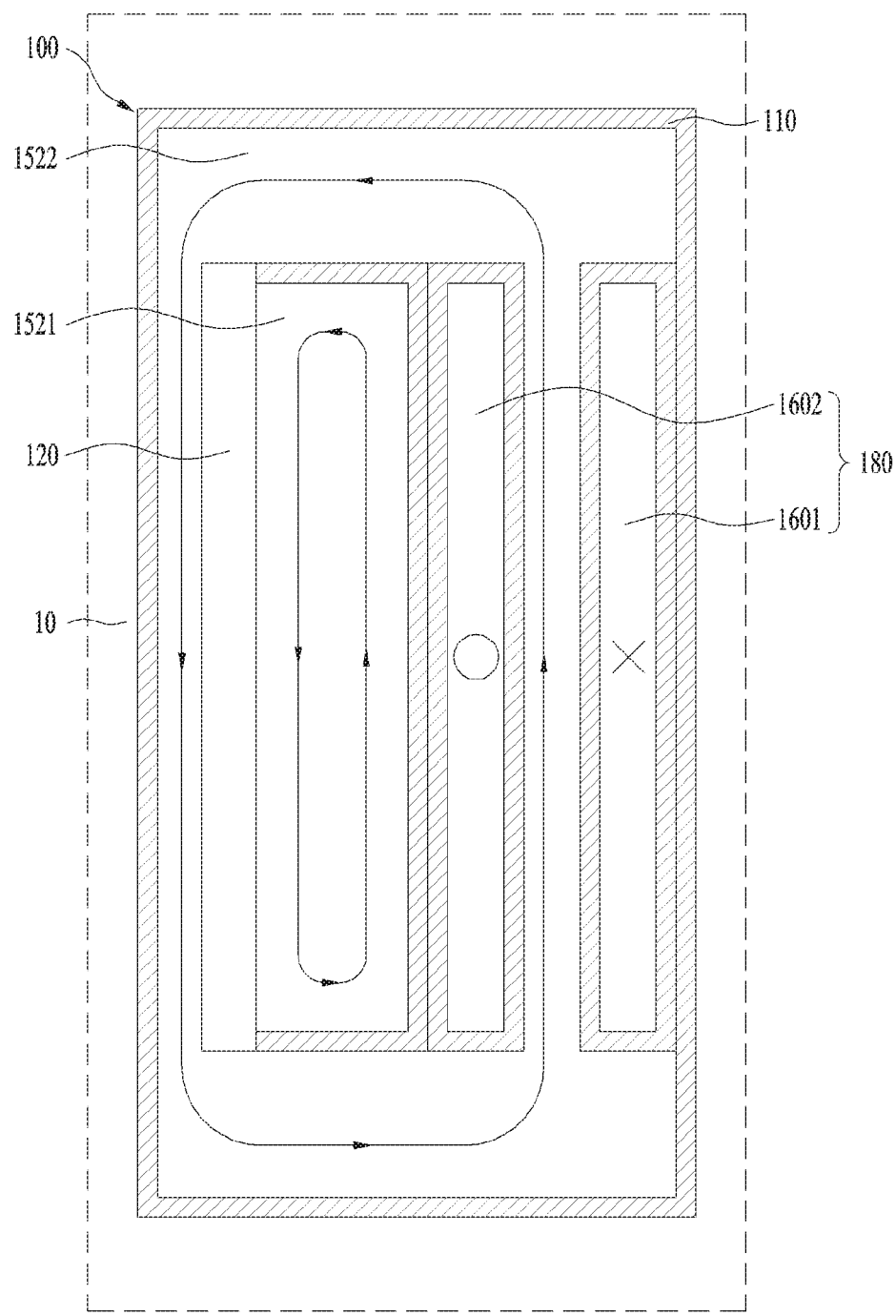
FIG. 15 is a conceptual diagram illustrating a still further embodiment of a display device in accordance with the present disclosure.

FIG. 15 are conceptual diagrams illustrating a still further embodiment of a display device 100 in accordance with the present disclosure.

A third open hole 180 may also an outer passage which penetrates the display device 100 and the third open hole may be formed by a fourth region provided in the outer surface of the outer case 110.

Figure 16:
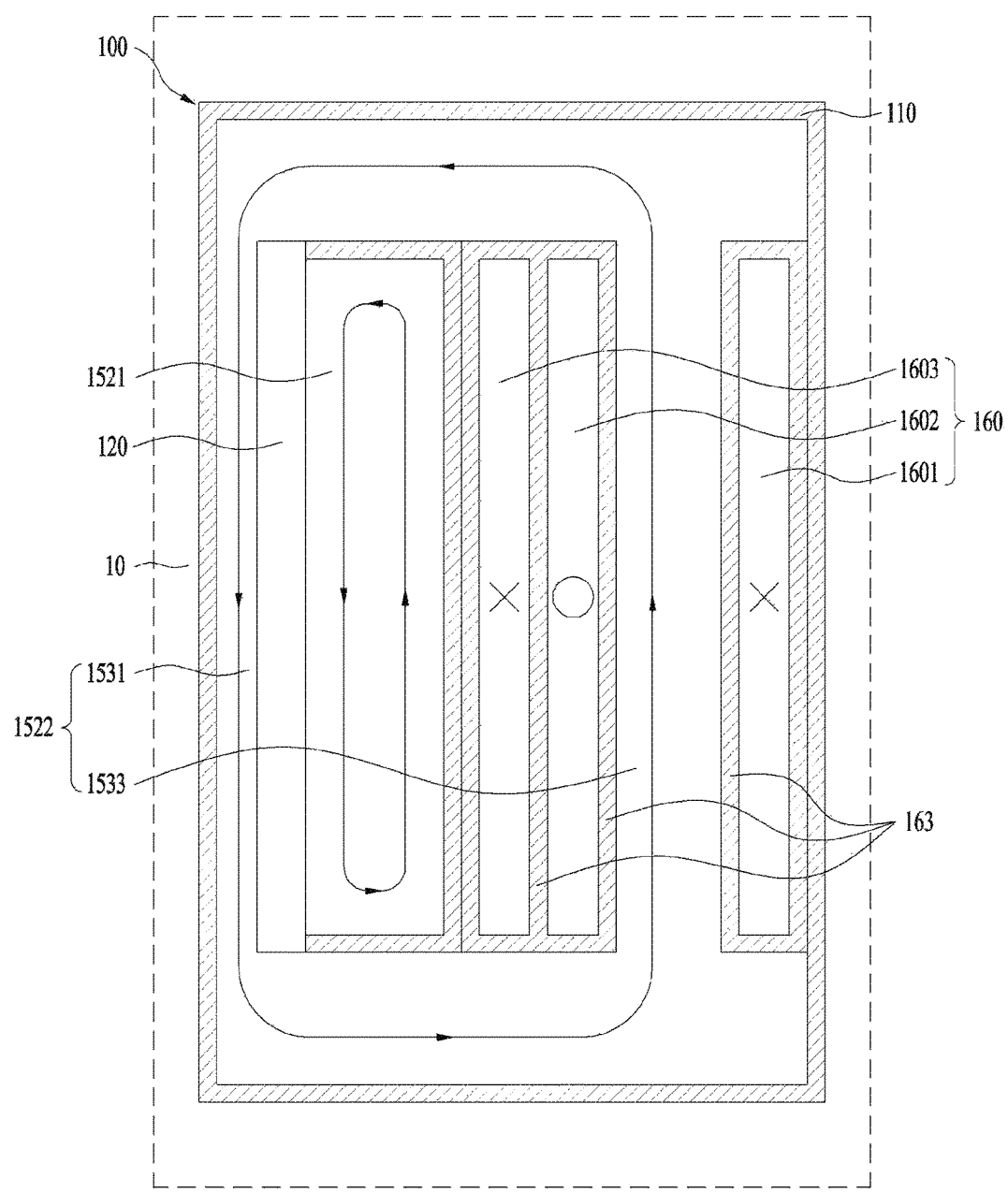
FIG. 16 is a conceptual diagram illustrating a still further embodiment of a display device in accordance with the present disclosure.

In the embodiments of FIGS. 15 and 16, at least one heat radiation portions 1601, 1602 and 1603 is formed as the third open hole 180 which is spaced apart from the other heat radiation portions. A connecting portion may connect the spaced heat radiation portions with each other. The connecting portion is provided to connect a ⊏-shaped outer passage as one continuous passage.

For example, the first heat radiation portion 1601 is provided toward the rear surface of the display device 100 to form one rear surface region of the outer case 110 and the second heat radiation portion 1602 may be spaced apart from the first heat radiation portion 1602.

As the first heat radiation portion 1601 is spaced the maximum gap apart from the second heat radiation portion 1602, the third open hole 180 may be configured to minimize the possibility of the re-drawing of the heated air exhausted via the outlet.

If the heat radiation portion closer to the rear surface region of the display device 100 may be the first heat radiation portion 1601 and the outlet of the third open hole 180 is provided in one end of the first heat radiation portion 1601, the outer passage of the third open hole 180 is capable of exhaust the heated air via the outlet and exchanging heat with the air of the external space 10 via the outer surface of the first heat radiation portion 1601 and then improving the heat radiation efficiency.

In this instance, the second closed space 1522 of the internal space may form a closed loop for circulating around the front surface space 1531 and the open hole spaced portion 1533 so as to disperse the generated heat.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds, are therefore intended to be embraced by the appended claims.

What is claimed is:

1. A display device comprising:
a display module;
an outer case in which the display module is mounted and defining an internal space which is closed airtight from the outside;
an inner case coupled to the display module,
wherein the inner case which partitions off the internal space into a first closed space having a rear surface of the display module exposed thereto and a second closed space having a front surface of the display module exposed thereto, and
wherein the first closed space is surrounded by the second closed space with respect to one cross section; and
a first open hole configured to allow a first region of an outer surface of the outer case and a second region of an outer surface of the inner case adjacent to the first region to form an outer passage,
wherein the first open hole passes between the first closed space and the second closed space.

2. The display device of claim 1, wherein the outer case comprises a plurality of outer surfaces which are toward different directions, respectively, and
an inlet of the first open hole is formed in one of the outer surfaces and an outlet of the first open hole is formed in another one of the outer surfaces.

3. The display device of claim 1, further comprising:
a partition bracket provided between the first region and the second region and configured to partition off the inlet and the outlet of the first open hole,
wherein an inlet of the first open hole is formed in the first region of the outer case and an outlet of the first open hole is formed in the second region adjacent to the first region.

4. The display device of claim 3, wherein the partition bracket allows the first open hole to form a '⊏'-shaped passage.

5. The display device of claim 3, wherein the partition bracket comprises a branched bracket configured to widen an angle between a direction toward the inlet and a direction toward the outlet of the first open hole.

6. The display device of claim 1, wherein the first open hole comprises a guide bracket configured to bend air flow of an outer passage.

7. A display device comprising:
a display module;
an outer case in which the display module is mounted and defining an internal space which is closed airtight from the outside;
an inner case coupled to the display module,
wherein the inner case which partitions off the internal space into a first closed space having a rear surface of the display module exposed thereto and a second closed space having a front surface of the display module exposed thereto; and
a second open hole configured to allow a third region of an outer surface of the outer case to form an outer passage,
wherein the second open hole is surrounded by the first closed space and the first closed space forms a closed loop.

8. A display device comprising:
a display module;
an outer case in which the display module is mounted and defining an internal space which is closed airtight from the outside;
an inner case coupled to the display module,
wherein the inner case which partitions off the internal space into a first closed space having a rear surface of the display module exposed thereto and a second closed space having a front surface of the display module exposed thereto; and
a third open hole configured to allow a fourth region of an outer surface of the outer case to form an outer passage,
wherein the third open hole comprises:
a first heat radiation portion configured to form one of a rear surface of the outer case;
a second heat radiation portion spaced apart from the first heat radiation portion; and
a connecting portion configured to connect the first heat radiation and the second heat radiation portion with each other in one region to connect the outer passage as one continuous passage.

9. The display device of claim 8, wherein the second closed space forms a closed loop which circulates around a front surface space of the display module and a spaced gap between the first heat radiation portion and the second heat radiation portion.

* * * * *